United States Patent
Chen et al.

(10) Patent No.: US 11,854,913 B2
(45) Date of Patent: Dec. 26, 2023

(54) METHOD FOR DETECTING DEFECTS IN SEMICONDUCTOR DEVICE

(71) Applicant: TAIWAN SEMICONDUCTOR MANUFACTURING COMPANY LTD., Hsinchu (TW)

(72) Inventors: Yang-Che Chen, Hsin-Chu (TW); Wei-Yu Chou, Taichung (TW); Hong-Seng Shue, Hsinchu County (TW); Chen-Hua Lin, Yunlin County (TW); Huang-Wen Tseng, Hsinchu County (TW); Victor Chiang Liang, Hsinchu (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 243 days.

(21) Appl. No.: 17/397,416

(22) Filed: Aug. 9, 2021

(65) Prior Publication Data

US 2021/0366794 A1 Nov. 25, 2021

Related U.S. Application Data

(62) Division of application No. 16/254,060, filed on Jan. 22, 2019, now Pat. No. 11,088,037.

(Continued)

(51) Int. Cl.
*H01L 21/66* (2006.01)
*H01L 23/58* (2006.01)
*H01L 21/56* (2006.01)
*H01L 23/00* (2006.01)
*H01L 21/78* (2006.01)

(Continued)

(52) U.S. Cl.
CPC .......... *H01L 22/32* (2013.01); *G01R 31/2644* (2013.01); *H01L 21/565* (2013.01); *H01L 21/78* (2013.01); *H01L 21/82* (2013.01); *H01L 22/12* (2013.01); *H01L 23/562* (2013.01); *H01L 23/564* (2013.01); *H01L 23/585* (2013.01); *H01L 24/13* (2013.01); *H01L 2224/13024* (2013.01)

(58) Field of Classification Search
CPC ....... H01L 22/32; H01L 21/78; H01L 23/562; H01L 23/585
See application file for complete search history.

(56) References Cited

U.S. PATENT DOCUMENTS

2015/0035556 A1* 2/2015 Kaltalioglu ........ G01R 31/2601
324/762.03
2020/0381316 A1* 12/2020 Lee ......................... H01L 24/89

* cited by examiner

*Primary Examiner* — Dale E Page
*Assistant Examiner* — Wilner Jean Baptiste
(74) *Attorney, Agent, or Firm* — WPAT LAW; Anthony King

(57) ABSTRACT

A method for detecting defects in a semiconductor device including singulating a die having a substrate including a circuit region and an outer border, a plurality of detecting devices disposed over the substrate and located between the circuit region and the outer border, a first probe pad and a second probe pad electrically connected to two ends of each detecting device, and a seal ring located between the outer border of the die and the detecting devices. The method further includes probing the first probe pad and the second probe pad to determine a connection status of the detecting device, and recognizing a defect when the connection status of the detecting device indicates an open circuit.

20 Claims, 8 Drawing Sheets

Related U.S. Application Data

(60) Provisional application No. 62/724,237, filed on Aug. 29, 2018.

(51) Int. Cl.
*G01R 31/26* (2020.01)
*H01L 21/82* (2006.01)

METHOD FOR DETECTING DEFECTS IN SEMICONDUCTOR DEVICE

PRIORITY CLAIM AND CROSS-REFERENCE

This application is a divisional application of U.S. patent application Ser. No. 16/254,060 filed Jan. 22, 2019, which claims priority of U.S. provisional application Ser. No. 62/724,237 filed on 29 Aug. 2018, which is incorporated by reference in its entirety.

BACKGROUND

In electronics, an integrated circuit (IC) is a miniaturized electronic circuit (including semiconductor devices as well as passive components) that has been manufactured in the surface of a thin substrate of semiconductor material. In general, wafers are used as carriers for semiconductor fabrication during the production of integrated circuits (ICs). After semiconductor fabrication processes, a plurality of dies are formed on a wafer, and the wafer is sawed into individual chips once the fabrication is complete.

The sawing process, however, can damage the die. Accordingly, there have been attempts to test for defects generated during the die sawing process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
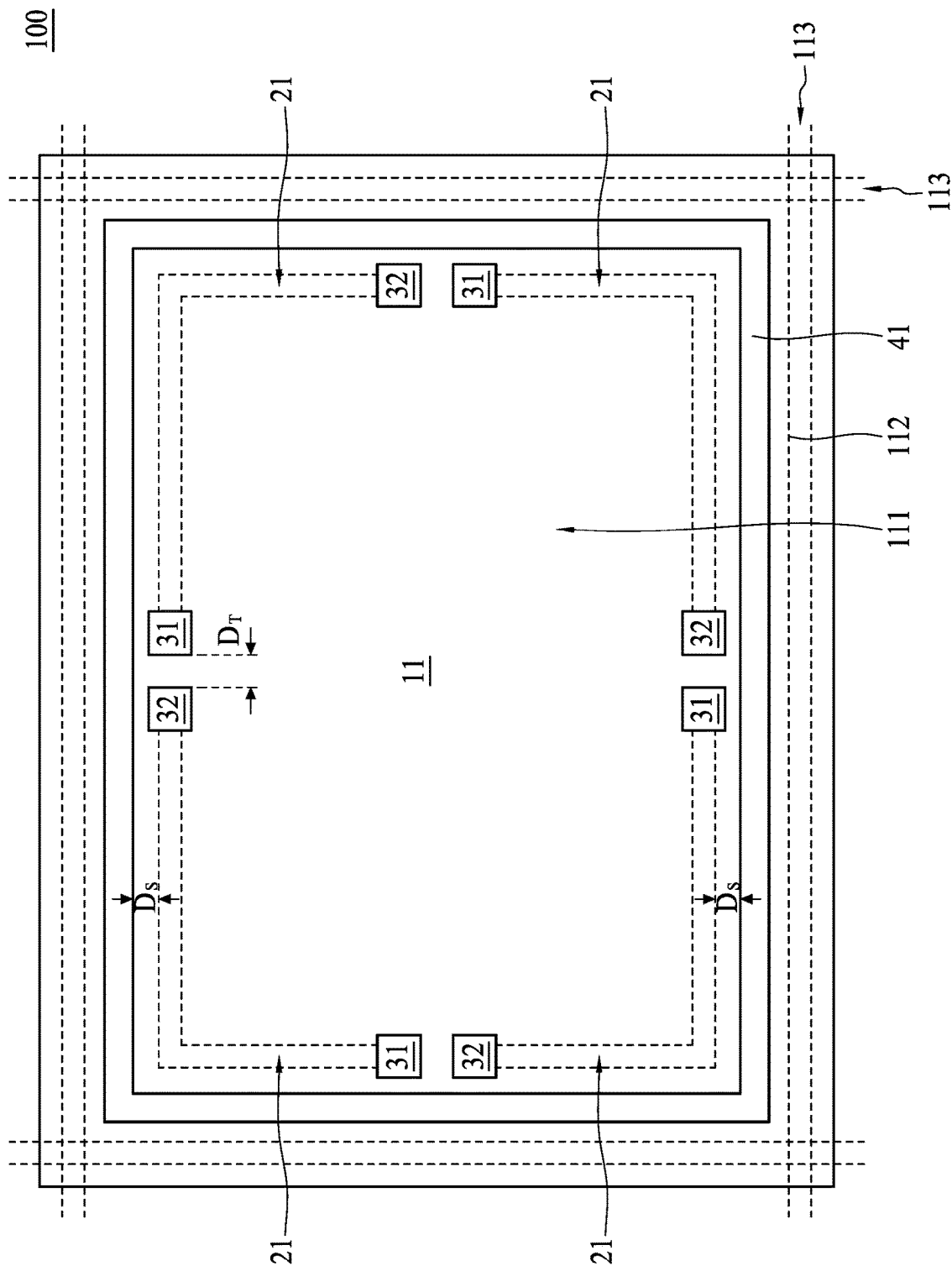
FIG. 1 is a schematic top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Generally, semiconductor devices are typically manufactured on a wafer. A wafer includes a plurality of dies, each die separated by scribe lines. Each die may include a seal ring forming an electrical and mechanical seal surrounding the various devices and circuits on the die. Once the fabrication of the integrated circuit on the wafer is complete, the wafer is divided into many chips, typically by conventional mechanical or laser sawing methods along the scribe lines. The seal rings can provide structural reinforcement and stop moisture and mobile ionic contaminants from entering a circuit region of a chip and improving the operational reliability.

However, the sawing process may damage the die. In particular, the mechanical stress caused by the saw can result in cracks and delamination in the die. A typical problem is that the low-k dielectric materials in the die are prone to damage incurred by stress introduced by the sawing process.

When cracks form in low-k dielectric materials, metal lines in the low-k dielectric materials may be damaged. Moreover, subsequent packaging and testing can also cause the cracks and/or delamination to become more serious. If the cracks and/or delamination become sufficiently serious, performance degradation or total device failure can result, particularly if the defects penetrate the seal ring of the device. Defects may arise anywhere, but generally occur at the corners or periphery of the die, and may be spread from the corners or periphery to the center.

Accordingly, there have been attempts to test for cracks, delamination, and other defects caused by die sawing processes. One disadvantage of the prior art attempts to identify defects is that the information provided by current tests is limited. For example, automated optical inspection (AOI) or SEM/OM processes are common methods to search for defects in semiconductor devices. However, typical automated optical inspection devices do not detect cracks or delamination defects of a cross-section of the die. Other methods, such as stress examination of a cross-section of the die, can propagate cracks, making accurate assessment of the defects difficult. Therefore, there is a need for a system and/or method for semiconductor device defect detection that overcomes at least some of the disadvantages associated with previous systems and methods.

Before addressing illustrated embodiments specifically, advantageous features and certain aspects of the exemplary embodiments are discussed generally. General aspects of embodiments described herein include a plurality of detecting devices, a first probe pad and a second probe pad electrically connected to two ends of each detecting device, and a seal ring to alleviate cracks, delaminations or other defects appearing in the semiconductor device.

The present disclosure therefore provides a semiconductor device and a method for detecting defects in a semiconductor device. The semiconductor device includes a substrate including a circuit region and an outer border, and a plurality of detecting devices disposed over the substrate and located between the circuit region and the outer border. The semiconductor device further includes a first probe pad and a second probe pad electrically connected to two ends of each detecting device, and a seal ring located between the outer border of the substrate and the detecting devices.

Figure 2:
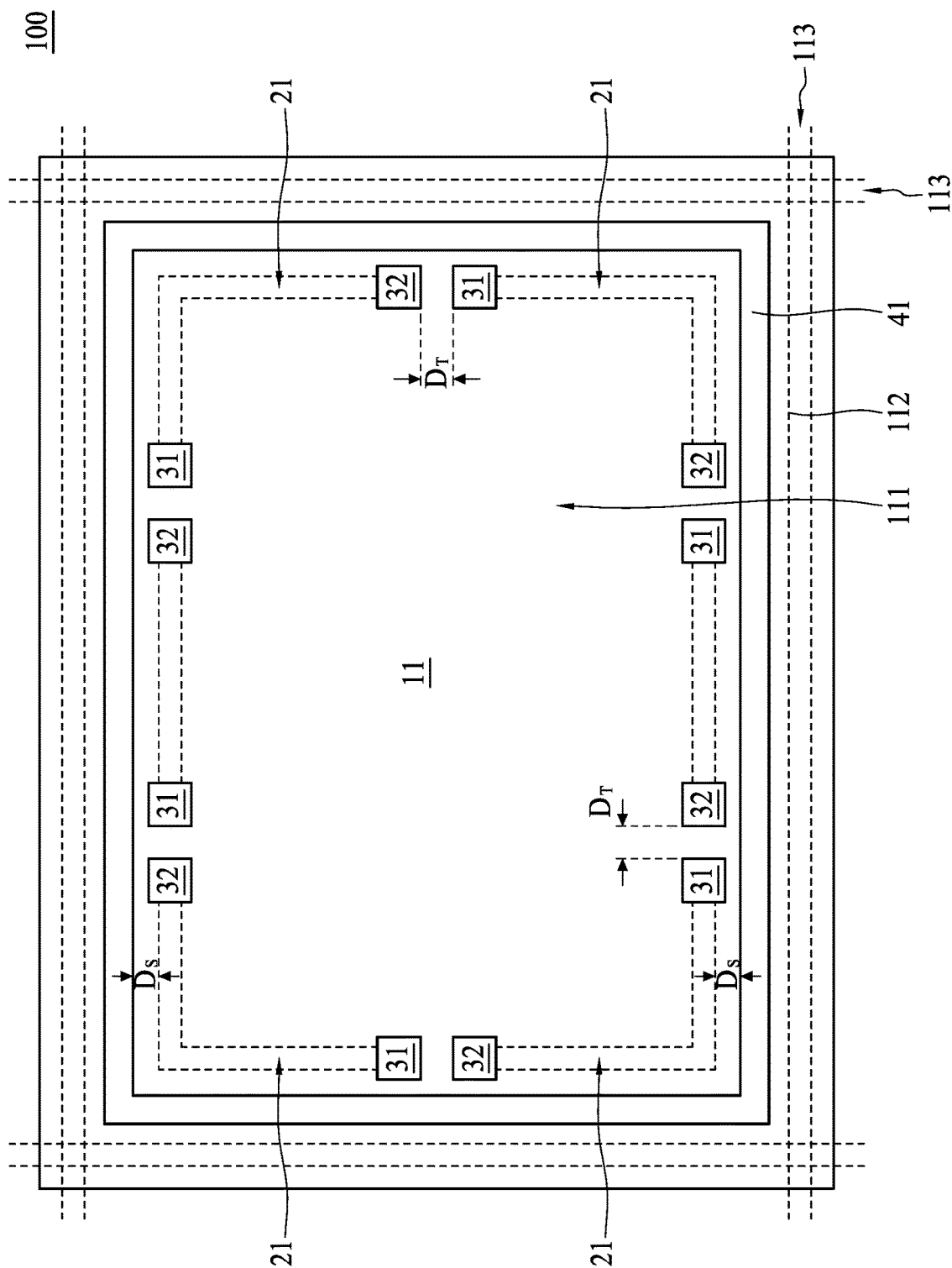
FIG. 2 is a schematic top view of a semiconductor device in accordance with some embodiments of the present disclosure.
Figure 3:
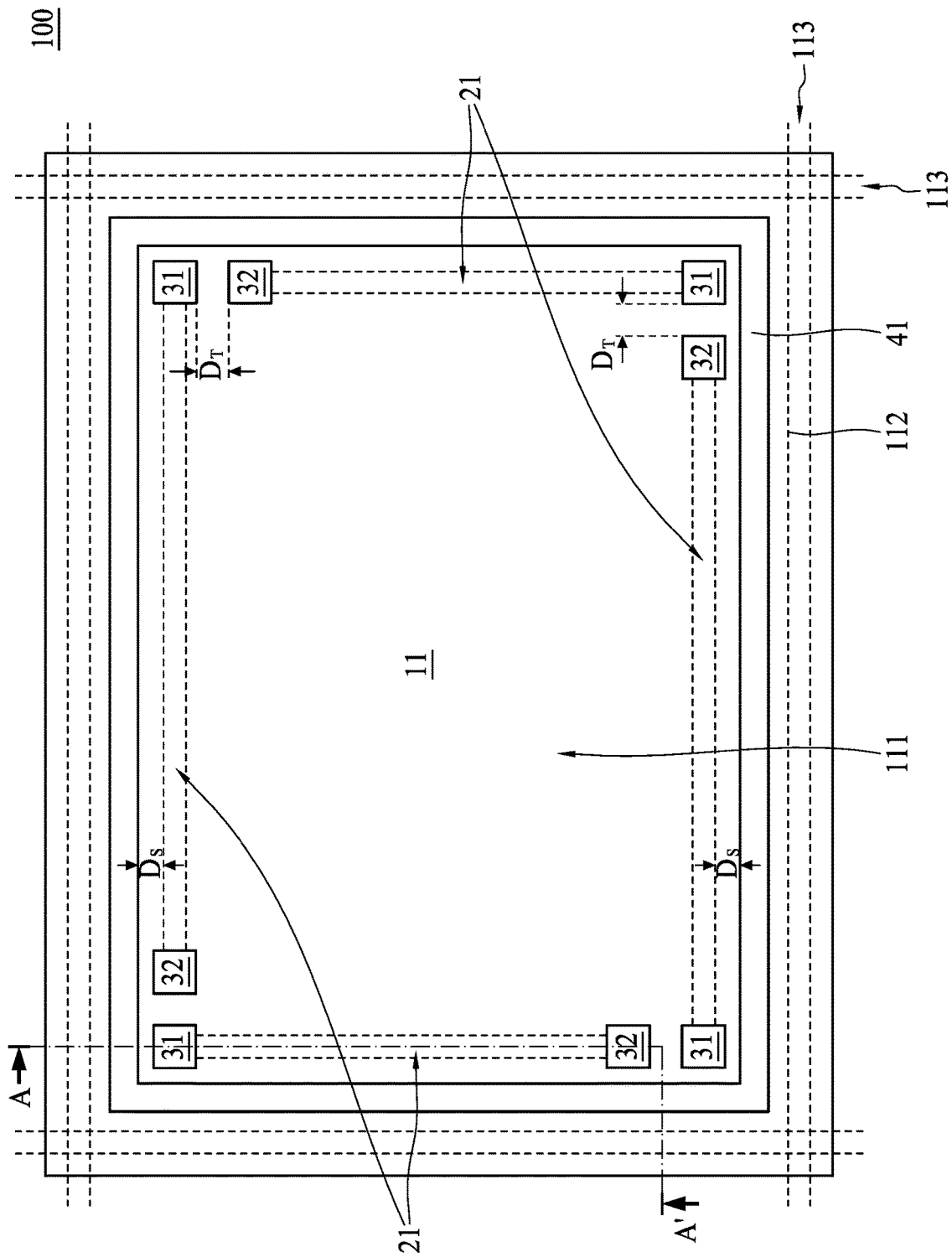
FIG. 3 is a schematic top view of a semiconductor device in accordance with some embodiments of the present disclosure.
Figure 4:
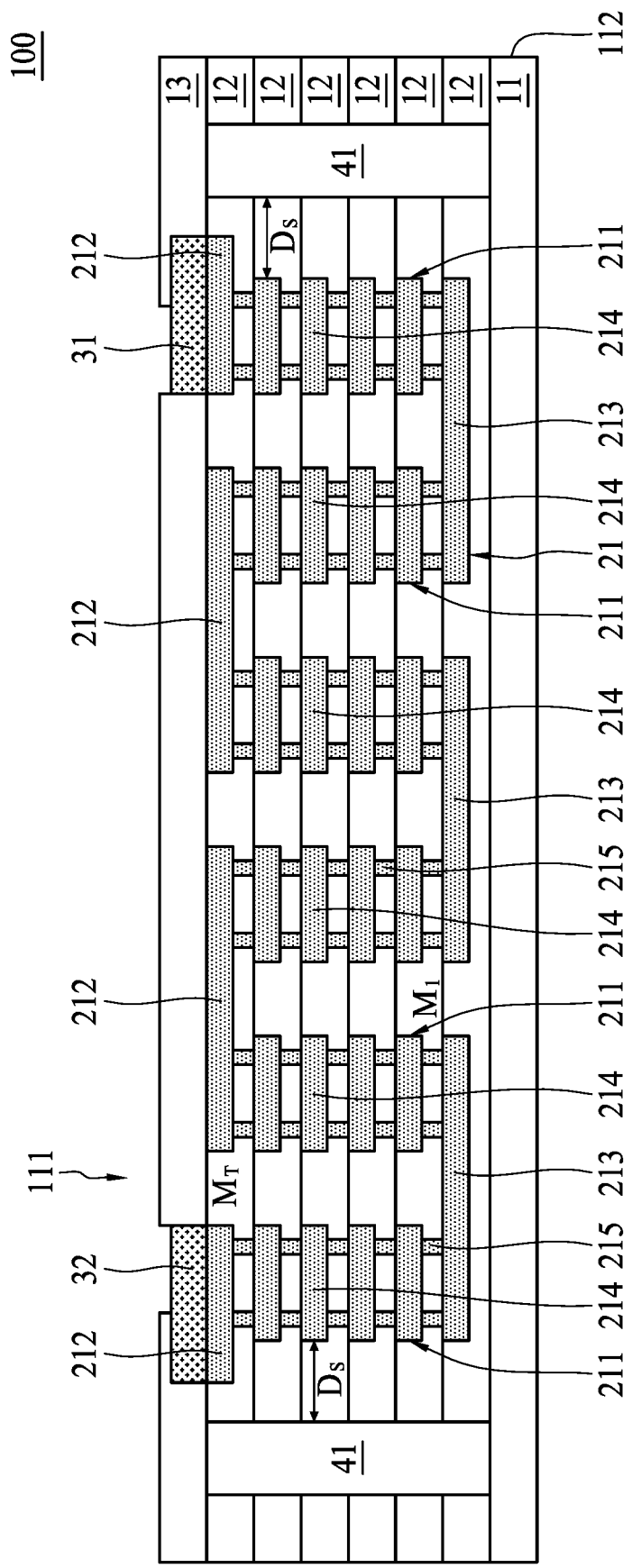
FIG. 4 is a cross-sectional view of a semiconductor device in accordance with some embodiments of the present disclosure.

FIGS. 1 to 3 are schematic top views illustrating a semiconductor device according to aspects of the present disclosure in some embodiments. FIG. 4 is a schematic cross-sectional view taken along a line A-A' in FIG. 3. In some embodiments, the semiconductor device can be a semiconductor die. Referring to FIGS. 1 to 4, a semiconductor device 100 includes a substrate 11 including a circuit region 111 and an outer border 112, and a plurality of detecting devices 21 disposed over the substrate 11 and located between the circuit region 111 and the outer border 112. The semiconductor device further includes a first probe pad 31 and a second probe pad 32 electrically connected to two ends of each detecting device 21, and a seal ring 41 located between the outer border 112 of the substrate 11 and the detecting devices 21. In some embodiments, the semiconductor device 100 further includes a plurality of dielectric layers 12 disposed over the substrate 11, wherein the detecting devices 21 and the seal ring 41 are disposed within the plurality of dielectric layers 12.

In some embodiments, the semiconductor device 100 over the substrate 11 is located on an inner side of a scribe line (alternatively referred to as a dicing line or a cutting line) 113. In a die sawing operation, the semiconductor device 100 is separated along the scribe line 113 by, e.g., laser cutting or blade cutting. The boundary of the semiconductor device 100 will be accordingly formed, and can be regarded as an outer border 112 of the substrate 11. After the die sawing operation, however, the outer border 112 of the substrate 11 may be slightly deviated from the scribe line 113. In some embodiments, the outer border 112 of the semiconductor device 100 may be slightly shifted outwardly (e.g., shifted to the left side) or inwardly (e.g., shifted to the right side).

In some embodiments, the circuit region 111 of the substrate 11 includes a circuitry, such as a memory circuit, e.g., a dynamic random access memory (DRAM) circuit, a static random access memory (SRAM) circuit, a non-volatile memory circuit and/or other memory circuits, a mixed-signal circuit, a signal processing circuit, a logic circuit, an analog circuit, other circuits, and/or any combinations thereof. It should be noted that the circuit region 111 in FIGS. 1 to 4 is merely illustrative, and the scope of the application is not limited thereto. In some embodiments, the circuit region 111 includes at least one circuitry segment, e.g., a logic circuit segment and a memory circuit segment. In some embodiments, the logic circuit segment and the memory circuit segment are electrically coupled with each other.

In some embodiments, the material of the substrate 11 may include polysilicon, silane ($SiH_4$), di-silane ($Si_2H_6$), di-chlorosilane ($SiCl_2H_4$), silicon germanium, gallium arsenic, or other suitable semiconductor materials so as to function as a conductive material under certain conditions. In some embodiments, the substrate 11 further includes doped regions, such as a P-well, an N-well, and/or a doped active region such as a P+ doped active region. In some embodiments, the substrate 11 may further include other features, such as a buried layer and/or an epitaxy layer. Furthermore, the substrate 11 may be a semiconductor on insulator such as silicon on insulator (SOI). In some embodiments, the substrate 11 may include a doped epitaxy layer, a gradient semiconductor layer, and/or a semiconductor layer overlying another semiconductor layer of a different type such as a silicon layer on a silicon germanium layer. In some embodiments, the substrate 11 may include a multilayer silicon structure or a multilayer compound semiconductor configuration. In some embodiments, the substrate 11 includes an inter-layer dielectric (ILD) layer. In some embodiments, the ILD layer may be a silicon oxide layer or any suitable ILD layer.

In some embodiments, the semiconductor device 100 further comprises a plurality of dielectric layers 12 disposed over the substrate 11, wherein the detecting devices 21 and the seal ring 41 are disposed within the dielectric layers 12. In some embodiments, the dielectric layers 12 include low-k dielectric material. The dielectric constant (k value) of the low-k dielectric material may be lower than 3.0, or lower than about 2.5, and the dielectric material is therefore also referred to as an extreme low-k (ELK) dielectric material. Relatively low density, lack of mechanical strength and sensitivity to thermal stress make low-k dielectric material very prone to damage. Conventional mechanical wafer dicing and scribing techniques are known to cause cracks, delaminations, and other types of defects in low-k dielectric materials, thus damaging the semiconductor device 100. To mitigate these problems without negatively affecting performance of the semiconductor device 100, the configuration and arrangement of the detecting devices 21 and the seal ring 41 disposed within the dielectric layers 12 must be specially designed.

The material of the dielectric layers 12 may include organic dielectric material such as organic silicate glass (OSG), porous methyl silsesquioxane (p-MSQ), hydrogen silsesquioxane (HSQ), a combination thereof, or any other suitable organic low-k or extreme low-k dielectric material. In some embodiments, the material of the dielectric layers 12 may include inorganic dielectric material such as carbon-doped silicon oxide, fluorine-doped silicate glass (FSG), a combination thereof, or any other suitable inorganic low-k or extreme low-k dielectric material. In some embodiments, other suitable dielectric materials, such as silicon oxide or phosphosilicate glass (PSG), may also be used. In some embodiments, the dielectric layers 12 include silicon oxide.

In some embodiments, the seal ring 41 is disposed around the circuit region 111, which is disposed over a substrate 11. In some embodiments, the seal ring 41 is located between the outer border 112 of the substrate 11 and the detecting devices 21. As is known in the art, the seal ring 41 forms a ring surrounding the circuit region 111, and is formed of metal lines and connecting vias. Since the seal ring 41 is a tightly interconnected structure, it not only provides mechanical support and structural reinforcement to the semiconductor device 100, but also prevents moisture and/or mobile ionic contaminants from penetrating through edges of the semiconductor device 100. In some embodiments, the seal ring 41 can be made of at least one material, such as copper, aluminum, aluminum copper, aluminum silicon copper, tungsten, titanium, tantalum, titanium nitride, tantalum nitride, nickel silicide, cobalt silicide, other proper conductive materials, or combinations thereof. In some embodiments, the seal ring 41 is electrically isolated from the detecting devices 21. It should be noted that the single seal ring 41 shown in each of FIGS. 1 to 3 is merely illustrative, and the scope of the application is not limited thereto. In some embodiments, two or more seal rings 41 can be disposed around the circuit region 111.

The detecting devices 21 and the first and second probe pads 31, 32 electrically connected to two ends of each detecting device 21 may be used to determine whether the semiconductor device 100 has defects. In some embodiments, the detecting devices 21 and the first and second probe pads 31, 32 may be used to determine whether the dielectric layers 12 have cracks. In some embodiments, the detecting devices 21 and the first and second probe pads 31, 32 may be used to determine whether the dielectric layers 12 are delaminated from the substrate 11. The detecting devices 21 and the first and second probe pads 31, 32 are disposed over the substrate 11 and located between the circuit region 111 and the outer border 112 of the substrate 11.

In some embodiments, the detecting devices 21 and the first and second probe pads 31, 32 are located between the circuit region 111 and the seal ring 41. That is, the detecting devices 21 and the first and second probe pads 31, 32 are arranged within the inner periphery of the seal ring 41. In this case, if one of the detecting devices 21 on the semiconductor device 100 is damaged, it indicates that the seal ring 41 is also damaged. Although the circuit region 111 on the inner side of the detecting device 21 may or may not be damaged, one skilled in the art will understand that a defect that erodes the integrity of the seal ring 41 can greatly degrade the performance of the semiconductor device 100, and such a defect can be sufficient cause to discard the semiconductor device 100. Conversely, if the detecting devices 21 on the semiconductor device 100 are not damaged, the seal ring 41 may or may not be damaged, but the circuit region 111 on the inner side of the detecting devices 21 is not damaged. Therefore, the semiconductor device 100 can be packaged. In other words, the detecting devices 21 are used as a quality monitor for the circuit region 111, but not for the seal ring 41.

The detecting devices 21 can be arranged and configured to detect and identify an approximate extent and/or location of a defect in the semiconductor device 100. In some embodiments, the detecting devices 21 are separated from each other. The number of detecting devices 21 is not particularly limited. In some embodiments, two adjacent detecting devices 21 are separated by a distance $D_T$. One skilled in the art will understand that the distance $D_T$ can be configured to optimize the area of the semiconductor device 100 covered by the detecting devices 21. For example, the distance $D_T$ can be configured based on whether the detecting devices 21 are situated at or near a high-defect-probability section of the semiconductor device 100, such as, for example, a corner of the semiconductor device 100. Other configurations can also be employed.

In some embodiments, as shown in FIG. 1, the shape of the semiconductor device 100 is a rectangle or a square, and four detecting devices 21 pass through each corner of the semiconductor device 100. In some embodiments, as shown in FIG. 2, six detecting devices 21 are evenly distributed around the circuit region 111, wherein four detecting devices 21 pass through each corner of the semiconductor device 100. In some embodiments, as shown in FIG. 3, four detecting devices 21 are arranged in a rectangle or a square. FIGS. 1 to 3 illustrate only four or six detecting devices 21 for clarity and simplicity, but such example is intended to be illustrative only, and is not intended to be limiting. In some embodiments, each detecting device 21 is electrically isolated from or independent of other detecting devices 21.

In some embodiments, the detecting devices 21 extend along the seal ring 41 in a parallel fashion and are separated from the seal ring 41 by a distance $D_s$. The distance $D_s$ can be determined based on a variety of factors, including, for example, the size of the semiconductor device 100, design rules for the semiconductor device 100, variables relating to the wafer on which the semiconductor device 100 is manufactured, width between adjacent dies on the wafer, and other factors, as one skilled in the art will understand. In some embodiments, the distance $D_s$ is between 10 µm and 20 µm. In some embodiments, the distance $D_s$ is less than 10 µm. In some embodiments, the distance $D_s$ between each detecting device 21 and the seal ring 41 can be the same or different depending on the actual demand.

In some embodiments, the material of the detecting devices 21 is not particularly limited. In some embodiments, the detecting devices 21 include metal. In some embodiments, the detecting devices 21 include aluminum, chromium, gold, molybdenum, platinum, tantalum, titanium, silver, copper, tungsten and/or an alloy thereof.

In some embodiments, as shown in FIG. 4, each of the detecting devices 21 is in a chain configuration. In some embodiments, each of the detecting devices 21 is a daisy chain. In some embodiments, each of the detecting devices 21 comprises a plurality of connection structures 211, a plurality of top conductive layers 212, and a plurality of bottom conductive layers 213, wherein the top conductive layers 212 and the bottom conductive layers 213 are alternately arranged between the connection structures 211. In some embodiments, each of the connection structures 211 is located between one of the top conductive layers 212 and one of the bottom conductive layers 213. In some embodiments, the bottom conductive layers 213 are disposed over the substrate. In some embodiments, the top conductive layers 212 are disposed over the bottom conductive layers 213. In some embodiments, the connection structures 211 are serially connected by the top conductive layers 212 and the bottom conductive layers 213. In some embodiments, the bottom conductive layers 213 are distributed in a bottom metallization layer $M_1$ of an interconnection structure, and the top conductive layers 212 are distributed in a top metallization layer $M_T$ of the interconnection structure. In some embodiments, two adjacent connection structures 211 are electrically connected by the top conductive layer 212 or the bottom conductive layer 213, alternatively. In some embodiments, two ends of each bottom conductive layer 213 are electrically connected to the two adjacent connection structures 211.

In some embodiments, each of the connection structures 211 includes a plurality of metal layers 214 and a plurality of connecting vias 215, the metal layers 214 are formed in a stacking configuration, and the connecting vias 215 connect the metal layers 214. In some embodiments, the metal layers 214 and the connecting vias 215 can be referred to as a dual damascene structure. In some embodiments, an interconnection structure (not shown) disposed in the circuit region 111, the detecting devices 21 and the seal ring 41 can be referred to as dual damascene structures. The interconnection structure, the detecting devices 21 and the seal ring 41 are electrically isolated from each other.

The first and second probe pads 31, 32 are configured to transfer a test signal from a testing apparatus to each of the detecting devices 21. The first and second probe pads 31, 32 are connected to two different top conductive layers 212 at the two ends of each detecting device 21. In some embodiments, each of the detecting devices 21 extends from a location beneath one of the first probe pads 31 to a location beneath one of the second probe pads 32.

In some embodiments, one or more passivation layers 13 are formed over the detecting devices 21 and the dielectric layers 12, and each of the first probe pad 31 and the second probe pad 32 is exposed through an opening in a passivation layer 13. In some embodiments, the shape of each of the first probe pad 31 and the second probe pad 32 from the top view is not particularly limited, and may be adjusted according to the actual needs. In some embodiments, the passivation layer(s) may be a polyimide, a borophosphosilicate glass (BPSG), silicon nitride (SiN), polybenzoxazole (PBO), a combination thereof, and/or the like, and may be formed using a spin-on technique, CVD, ALD, PVD, a combination thereof, and/or the like. Openings are formed through the passivation layer 13 to expose the first probe pad 31 and the second probe pad 32.

Figure 5:
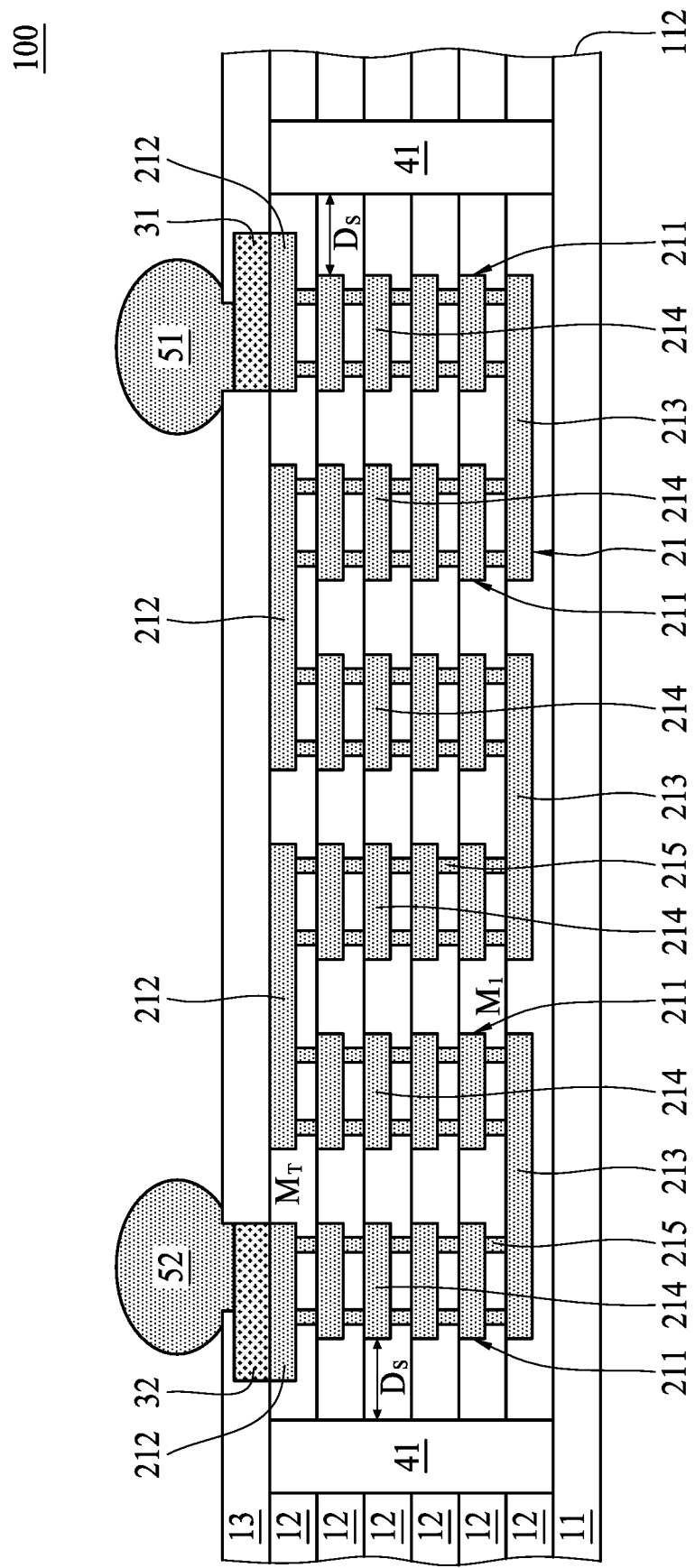
FIG. 5 is a cross-sectional view of a semiconductor device in accordance with some embodiments of the present disclosure.

FIG. 5 is a cross-sectional view illustrating the semiconductor device according to aspects of the present disclosure in some embodiments. In some embodiments, referring to FIG. 5, the semiconductor device 100 further includes a first bump 51 and a second bump 52 disposed over each of the first probe pad 31 and the second probe pad 32, and the first and second bumps 51, 52 are exposed through openings in a passivation layer 13. The openings are formed in the passivation layer 13, and the first and second bumps 51, 52 are electrically connected to the corresponding first probe pad 31 or second probe pad 32. In some embodiments, the first and the second bumps 51, 52 are conductive balls. In some embodiments, the first and second bumps 51, 52 are respectively formed on the first probe pad 31 and the second probe pad 32 by ECP and/or the like, and may comprise copper, tin, eutectic solder, lead free solder, nickel, and combinations thereof. In some embodiments, the first and the second bumps 51, 52 are added to the semiconductor device 100 after the semiconductor device 100 is singulated.

Figure 6:
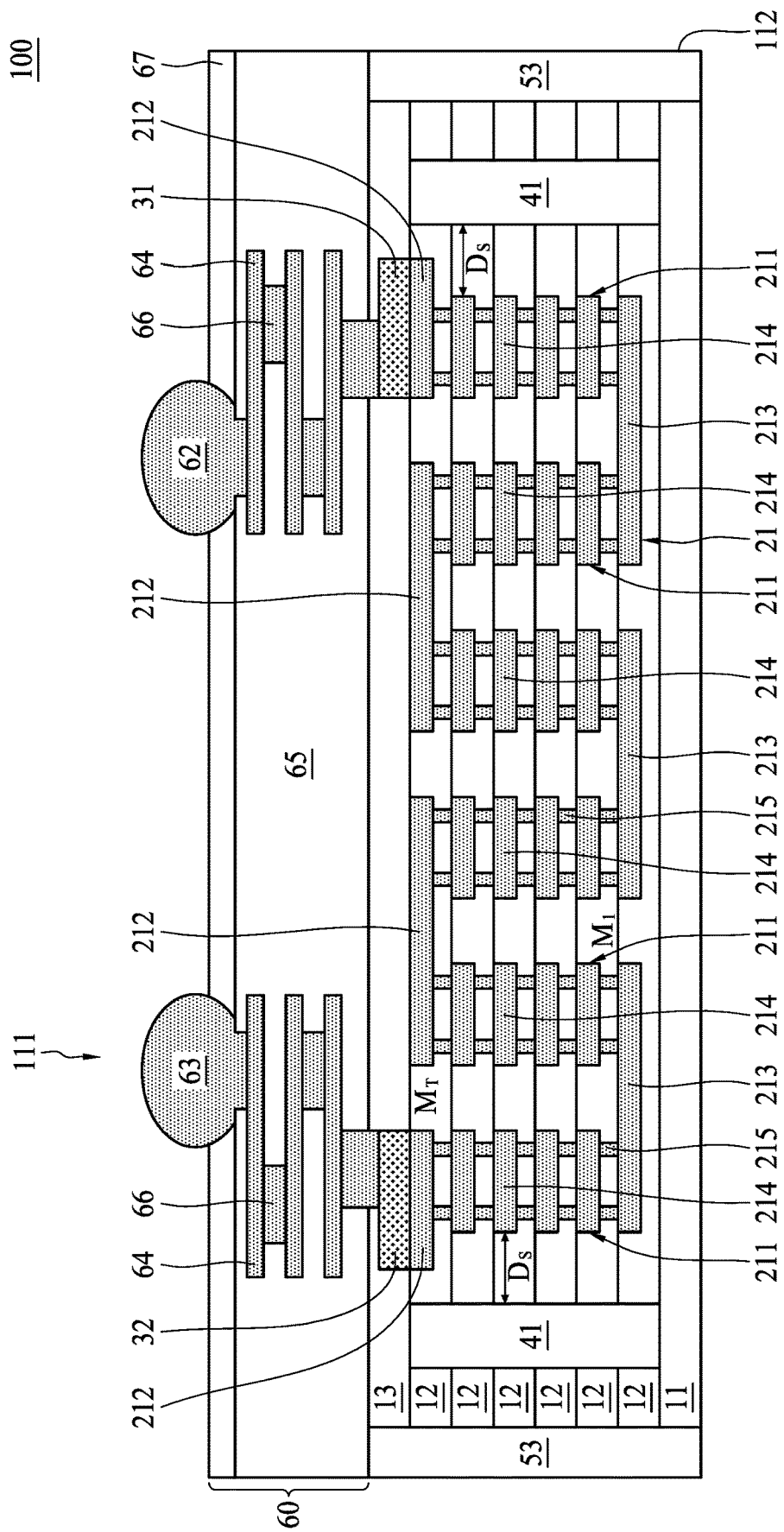
FIG. 6 is a cross-sectional view of a semiconductor device in accordance with some embodiments of the present disclosure.

FIG. 6 is a cross-sectional view illustrating the semiconductor device according to aspects of the present disclosure in some embodiments. In some embodiments, referring to FIG. 6, after the semiconductor device 100 is singulated, the semiconductor device 100 can be referred to as a die. In some embodiments, a molding 53 is formed to encompass the semiconductor device 100. In some embodiments, the semiconductor device 100 further includes a redistribution layer (RDL) 61 disposed over the seal ring 41, the detecting devices 21, and the molding 53.

In some embodiments, the semiconductor device 100 further includes at least a first conductor 62 and at least a second conductor 63 disposed over the redistribution layer 61, wherein the first conductor 62 is electrically connected to the first probe pad 31 and the second conductor 63 is electrically connected to the second probe pad 32 through the redistribution layer 61. The redistribution layer 61 may include any combination of metallization layers 64, inter-metal dielectric (IMD) layers 65, vias 66, and passivation layers 67. In some embodiments, the redistribution layer 61 includes a number of metallization layers 64 in IMD layers 65. In some embodiments, vias 66 are formed between the metallization layers 64 in the IMD layers 65. In some embodiments, the metallization layers 64 are formed by depositing an IMD layer 65, etching the metallization pattern of the layer in the IMD layer 65 using, for example, acceptable photolithography techniques, depositing a conductive material for the metallization layers 64 in the IMD layers 65, and removing any excess conductive material by, for example, CMP. The photolithography technique may include a single damascene process or a dual damascene process, particularly when vias 66 are formed through one of the IMD layers 65 to an underlying metallization layer 64.

In some embodiments, the IMD layers 65 may include an oxide dielectric, such as a borophosphosilicate glass (BPSG), or other dielectric material. In some embodiments, the conductive material of the metallization layers 64 may be, for example, copper, nickel, aluminum, copper aluminum, tungsten, titanium, combinations thereof, and/or the like. In some embodiments, the metallization layers 64 may include barrier layers (not shown) between the conductive material and the IMD material, and other dielectric layers, such as etch stop layers made of, for example, silicon nitride, may be formed between the IMD layers 65.

Figure 7:
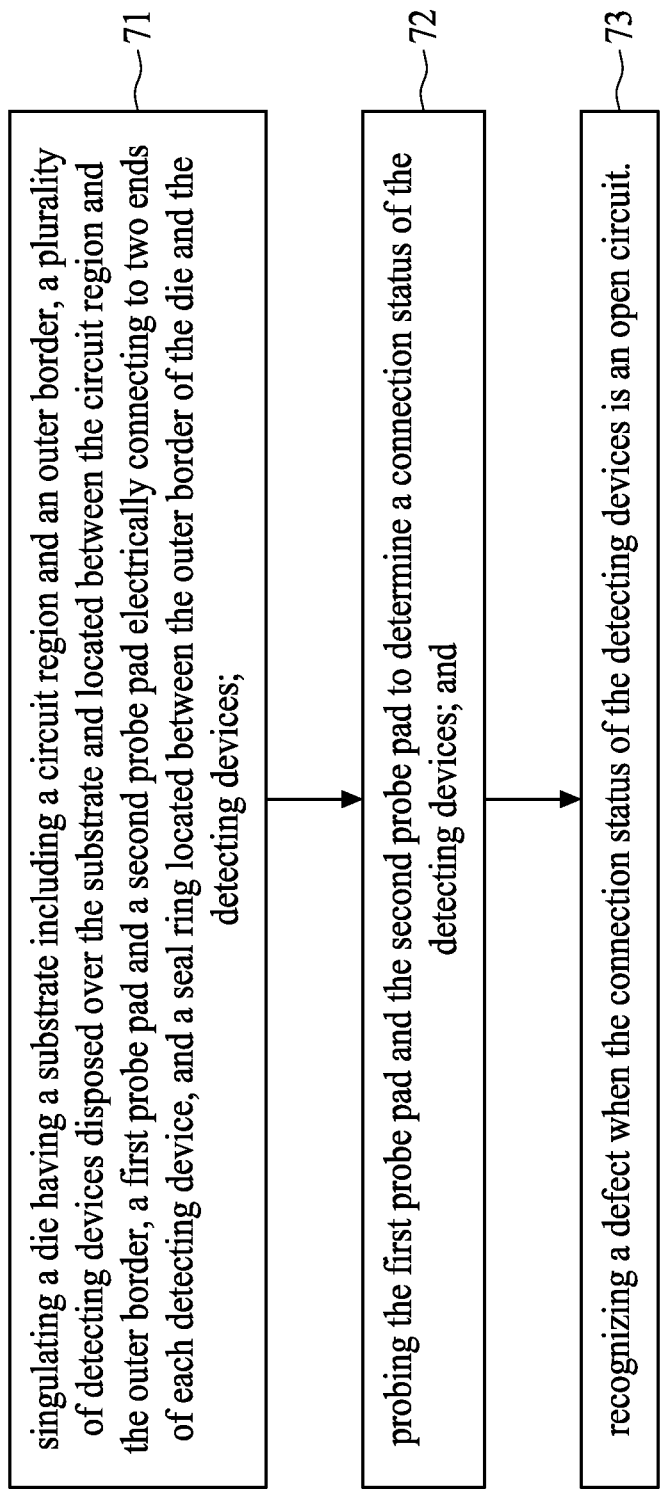
FIG. 7 is a flowchart representing a method for detecting defects in a semiconductor device according to aspects of the present disclosure in one or more embodiments.

In the present disclosure, a method for detecting defects in a semiconductor device is disclosed. In some embodiments, a semiconductor device is tested for defects by the method. The method includes a number of operations and the description and illustrations are not deemed as a limitation of the sequence of the operations. FIG. 7 is a flowchart depicting an embodiment of the method of manufacturing the semiconductor device. The method includes operations 71, 72 and 73. In some embodiments, the operations 71, 72 and 73 may be used to test the semiconductor device in a manner similar to that used to test the semiconductor device 100 illustrated in FIGS. 1 to 6.

The methods begin with operation 71, in which a die is singulated. The die has a substrate 11 including a circuit region 111 and an outer border 112, a plurality of detecting devices 21 disposed over the substrate 11 and located between the circuit region 111 and the outer border 112, a first probe pad 31 and a second probe pad 32 electrically connected to two ends of each detecting device, and a seal ring located between the outer border of the die and the detecting devices. In some embodiments, the die is a singulated semiconductor device similar to any one of the semiconductor devices 100 illustrated in FIGS. 1 to 6. In some embodiments, the semiconductor device 100 of the present disclosure may be scribed along the scribe lines 113 to separate the die by mechanical or laser cutting methods.

In some embodiments, the first probe pad 31 and the second probe pad 32 as shown in FIG. 4 are probed to determine a connection status of the detecting device 21 in operation 72. In some embodiments, the first probe pad 31 and the second probe pad 32 are probed to determine a connection status of the detecting device 21 through the first and second bumps 51, 52 as shown in FIG. 5 in operation 72. In some embodiments, the first probe pad 31 and the second probe pad 32 are probed to determine a connection status of the detecting device 21 through the first and second conductors 62, 63 and the redistribution layer 61 as shown in FIG. 6 in operation 72.

Figure 8:
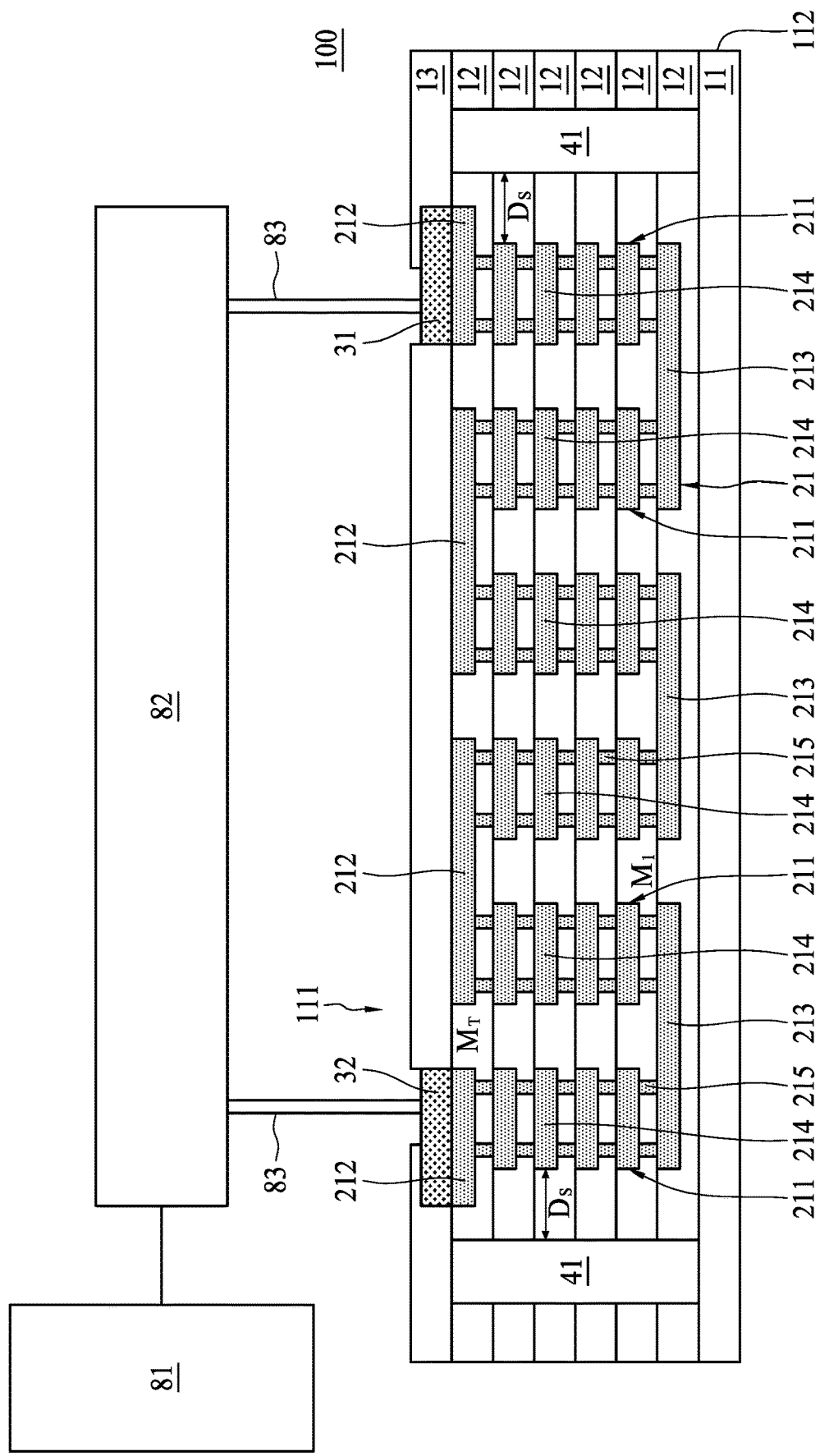
FIG. 8 is a schematic view illustrating probing of a semiconductor device according to aspects of the present disclosure in one or more embodiments.

In some embodiments, by applying a test signal to the first probe pad 31 and sensing the test signal at the second probe pad 32 of the detecting device 21 under test, it can be determined whether the detecting device 21 under test has a void or discontinuity. That is, according to the test signal, the continuity profile of the detecting device 21 under test can be determined. In some embodiments, all of the detecting devices 21 can be measured at a same time. In some embodiments, the detecting devices 21 can be measured independently. In some embodiments, as shown in FIG. 8, the method includes providing a test signal to the first probe pad 31 by a testing apparatus 81 via the probes 83 of a probe card 82, and detecting the test signal at the second probe pad 32.

In some embodiments, the first and second bumps 51, 52 are respectively provided on the first probe pad 31 and the second probe pad 32 as shown in FIG. 5, so that the first probe pad 31 and the second probe pad 32 are probed through the first and second bumps 51, 52. In some embodiments, the probes 83 of the probe card 82 are attached to the first and second bumps 51, 52.

In some embodiments, the molding 53 is disposed to encompass the die, and the redistribution layer 61 is provided over the die and the molding 53, wherein the redistribution layer 61 is in contact with each of the first probe pad 31 and the second probe pad 32, and at least the first conductor 62 and at least the second conductor 63 are disposed over the redistribution layer 61 as shown in FIG. 6. In some embodiments, the first probe pad 31 and the second probe pad 32 are probed through the redistribution layer 61, the first conductor 62 and the second conductor 63. In some embodiments, the probes 83 of the probe card 82 are attached to the first conductor 62 and the second conductor 63.

Generally, a test signal can be applied to the first and second probe pads 31, 32 to test the conductivity of the conductive path provided by each detecting device 21. Testing the continuity profile of the detecting device 21 can include measuring voltage, resistance, current, and/or a variety of other variables that can change based on the structural and/or electro-mechanical integrity of a conductive path between two electrically connected first and second probe pads 31, 32. As abovementioned, the detecting devices 21 are generally configured such that their conductive paths' continuity changes in the presence of a defect in the semiconductor device 100.

In some embodiments, when there is no crack or delamination occurred, or the crack or delamination does not pass through the detecting device 21, the continuity profile of the conductive path between the first and second probe pads 31, 32 will not change. Thus the test signal applied to the first probe pad 31 can be received from the second probe pads 32.

Accordingly, the connection status of the detecting device 21 under test indicates a closed circuit, the structure of the detecting device 21 under test is determined to be intact, and it is recognized that there is no crack or delamination in the dielectric layers 12, or the crack or the delamination is tolerable.

In some embodiments, when a crack or delamination from the outer border 112 passes through the seal ring 41, at least and one of the detecting devices 21 may change the continuity profile of the conductive path between the first and second probe pads 31, 32 connected to the detecting device 21. For example, the conductive path may be broken by the crack or delamination. Thus the test signal applied to the first probe pad 31 cannot be received from the second probe pads 32, and an open circuit is observed. Accordingly, in operation 73, such defect is recognized when the connection status of the detecting device 21 under test indicates the open circuit, and it is recognized that a crack or delamination defect occurs.

Accordingly, the present disclosure therefore provides a semiconductor device and a method for detecting defects in a semiconductor device. The semiconductor device includes a substrate, a plurality of detecting devices, a first probe pad, a second probe pad and a seal ring. The detecting device is disposed over the substrate and located between the circuit region and the outer border. The first probe pad and the second probe pad electrically connect to two ends of each detecting device. The seal ring is located between the outer border of the substrate and the detecting devices. Consequently, the first probe pad and the second probe pad may be probed to determine a connection status of the detecting device, and the connection status of the detecting device may indicate whether the semiconductor device is cracked or delaminated.

Some embodiments of the present disclosure provide a method for detecting defects in a semiconductor device including singulating a die having a substrate including a circuit region and an outer border, a plurality of detecting devices disposed over the substrate and located between the circuit region and the outer border, a first probe pad and a second probe pad electrically connected to two ends of each detecting device, and a seal ring located between the outer border of the die and the detecting devices. The method further includes probing the first probe pad and the second probe pad to determine a connection status of the detecting device, and recognizing a defect when the connection status of the detecting device indicates an open circuit.

Some embodiments of the present disclosure provide a method for detecting defects in a semiconductor device including receiving a die comprising at least a detecting device, a first probe pad and a second probe pad electrically connected to two ends of the detecting device. The method further includes providing a test signal to the first probe pad, and detecting the test signal at the second probe pad to determine a connection status of the detecting device. The method further includes recognizing a defect when the connection status of the detecting device indicate an opening circuit.

Some embodiments of the present disclosure provide a method for detecting defects in a semiconductor device including receiving a die including at least a detecting device, a first pad and a second pad electrically connected to two ends of the detecting device. The method further includes disposing a molding to encompass the die. The method further includes forming a redistribution layer over the die and the molding. The method further includes forming at least a first conductor electrically connected to the first pad and a second electrically connected to the second pad. The method further includes providing a test signal to the first pad. The method further includes detecting the test signal at the second pad to determine a connection status of the detecting device. The method further includes recognizing a defect when the connection status of the detecting device indicates an open circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting defects in a semiconductor device, comprising:
   singulating a die having a substrate including a circuit region and an outer border, a plurality of detecting devices disposed over the substrate and located between the circuit region and the outer border, a first probe pad and a second probe pad electrically connected to two ends of each detecting device, and a seal ring located between the outer border of the die and the detecting devices;
   providing a first bump and a second bump respectively on the first probe pad and the second probe pad;
   probing the first probe pad and the second probe pad through the first bumps and the second bump to determine a connection status of the detecting devices; and
   recognizing a defect when the connection status of the detecting devices indicates an open circuit.

2. The method of claim 1, wherein the connection status of the detecting devices is determined by providing a test signal to the first probe pad, and detecting the test signal at the second probe pad.

3. The method of claim 1, wherein each of the detecting devices comprises:
   a plurality of connection structures;
   a plurality of top conductive layers; and
   a plurality of bottom conductive layers;
   wherein the top conductive layers and the bottom conductive layers are alternately arranged between the connection structures.

4. A method for detecting defects in a semiconductor device, comprising:
   receiving a die comprising at least a detecting device, a first probe pad and a second probe pad electrically connected to two ends of the detecting device;
   forming a first bump and a second bump respectively on the first probe pad and the second probe pad;
   providing a test signal to the first probe pad, and detecting the test signal at the second probe pad to determine a connection status of the detecting device; and
   recognizing a defect when the connection status of the detecting device indicates an open circuit.

5. The method of claim 4, wherein the die has a circuit region and an outer border, and the detecting device is disposed between the circuit region and the outer border.

6. The method of claim 5, wherein the die further comprises a seal ring.

7. The method of claim 6, wherein the seal ring is disposed between the outer border and the detecting device.

8. The method of claim 4, wherein the test signal is provided prior to the forming of the first bump and the second bump.

9. The method of claim 4, wherein the test signal is provided to the first probe pad through the first bump and to the second probe pad through the second bump.

10. The method of claim 4, further comprising:
    disposing a molding to encompass the die;
    forming a redistribution layer over the die and the molding; and
    forming at least a first conductor and at least a second conductor over the redistribution layer, wherein the first conductor is electrically connected to the first probe pad, and the second conductor is electrically connected to the second probe pad.

11. The method of claim 10, wherein the test signal is provided to the first probe pad and the second probe pad through the redistribution layer, the first conductor and the second conductor.

12. A method for detecting defects in a semiconductor device, comprising:
    receiving a die comprising at least a detecting device, a first pad and a second pad electrically connected to two ends of the detecting device;
    disposing a molding to encompass the die, wherein the at least detecting device is separated from the molding;
    forming a redistribution layer over the die and the molding;
    forming at least a first conductor electrically connected to the first pad and a second conductor electrically connected to the second pad;
    providing a test signal to the first pad;
    detecting the test signal at the second pad to determine a connection status of the detecting device; and
    recognizing a defect when the connection status of the detecting devices indicates an open circuit.

13. The method of claim 12, wherein the die has a circuit region and an outer border, and the detecting device is disposed between the circuit region and the outer border.

14. The method of claim 13, wherein the die further comprises a seal ring.

15. The method of claim 14, wherein the seal ring is disposed between the outer border and the detecting device.

16. The method of claim 14, wherein the detecting device extend along the seal ring in a parallel fashion and are separated from the seal ring by a distance.

17. The method of claim 12, wherein the test signal is provided to the first pad and the second pad prior to the disposing of the molding.

18. The method of claim 12, wherein the test signal is provided to the first pad and the second pad through the first conductor, the second conductor, and the redistribution layer.

19. The method of claim 12, wherein the at least detecting device comprises:
    a plurality of connection structures;
    a plurality of top conductive layers; and
    a plurality of bottom conductive layers;
    wherein the top conductive layers and the bottom conductive layers are alternately arranged between the connection structures.

20. The method of claim 19, wherein each of the connection structures is located between one of the top conductive layers and one of the bottom conductive layers.

* * * * *